March 21, 1961 S. R. MORRISON 2,975,638

ELECTRICAL HYGROMETER DEVICE

Filed Sept. 18, 1958

INVENTOR.
STANLEY R. MORRISON

BY Orrin M. Haugen
ATTORNEY

United States Patent Office 2,975,638

Patented Mar. 21, 1961

2,975,638

ELECTRICAL HYGROMETER DEVICE

Stanley R. Morrison, Minnetonka Village, Minn., assignor to Minneapolis-Honeywell Regulator Company, Minneapolis, Minn., a corporation of Delaware Filed Sept. 18, 1958, Ser. No. 761,750

9 Claims. (Cl. 73—336.5)

Figure 1:
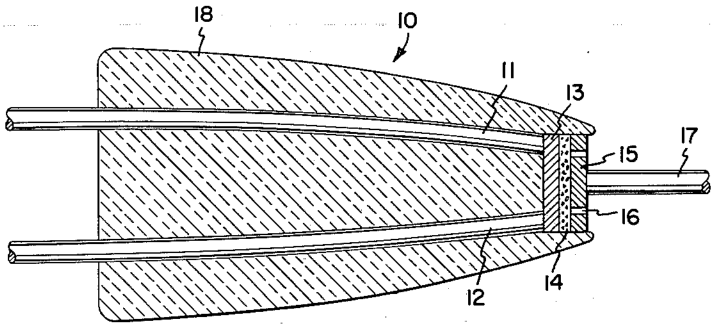

The present invention relates generally to a semi-conductor hygrometer, and more particularly to a hygrometer utilizing the Peltier effect or thermoelectric cooling available in a junction between a pair of dissimilar metals or alloys and wherein the quantity of current which passes through an electrically conductive salt film is controlled by the degree of saturation thereof, this film being in contact with the junction and arranged in current dividing or shunting relationship thereto. The subject apparatus will give a substantially continuous and rapid indication of dew-point or relative humidity with only very modest current requirements. In the past, it has been suggested that Peltier cooling be employed to cool a mirrored surface or the like and photoelectric means then be employed to provide an indication of the dew-point or relative humidity of the sample. Accordingly, the present invention does not require dependent or external electrical means for operation, a single circuit means being utilized for complete operation.

Briefly, this system includes a thermoelectric couple arranged to cool a certain surface by Peltier cooling, the junction surface holding or supporting a layer of salt having the characteristic of a relatively sharp drop in electrical resistance upon reaching a substantially saturated condition. The point at which this drop occurs may be defined as the "equilibrium moisture content" for the salt substance. The salt layer is accordingly arranged in electrical parallel relationship to the thermoelectric junction and acts as a variable drain or shunt for electrical current flowing through the junction and thereby holds or maintains the entire arrangement in electrical current carrying equilibrium or steady state. The quantity of current which passes through the shunt circuit is dependent upon the potential drop thereacross, or stated another way, is dependent upon the quantity of current required to hold the thermoelectric couple or junction at an equilibrium temperature after being cooled to a temperature at or below saturation. The current passing therethrough tends to heat the salt layer and thereby drive off the condensed water. In other words, an equilibrium balance will be achieved between the thermoelectric junction and the salt shunt arrangement, the current in the junction extracting heat, and the current in the salt layer generating heat to maintain the layer at an equilibrium water content.

It is therefore an object of the present invention to provide a reliable relative humidity or dew-point indicating device which utilizes the Peltier effect to cool a certain surface, and which apparatus includes a shunt circuit in electrical parallel relationship to the thermoelectric refrigerator for operation as an indication of the current carrying capacity of the system.

Figure 2:
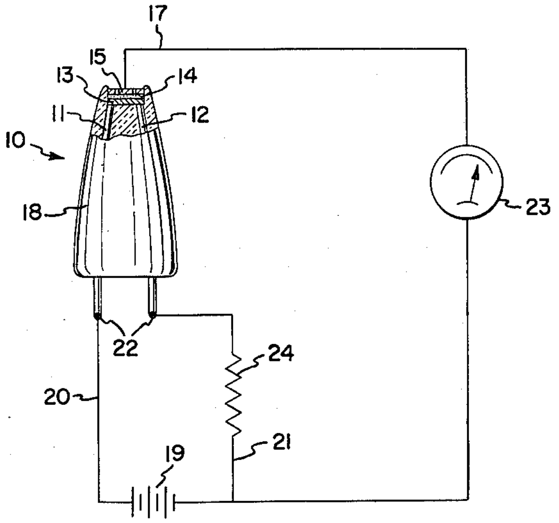

Other and further objects of the present invention will become apparent upon a study of the following specification, appended claims and accompanying drawings in which:

Figure 1 is a partial view of the thermoelectric cooling system prepared in accordance with the present invention; and Figure 2 is a schematic diagram illustrating a circuit application employing the apparatus of the present invention.

Referring now to the preferred form of the present invention as illustrated in Figures 1 and 2 of the accompanying drawings, the hygrometer apparatus generally designated 10 includes a pair of dissimilar metallic members 11 and 12 consisting essentially of bismuth and lead telluride respectively. The elements of the dissimilar metallic pair are arranged to mutually contact and be in electrical and thermal conducting relationship with metallic plate 13 which is prepared from a conductive metal such as copper, or the like. Superimposed on the copper plate 13 is a layer of salt such as the sodium chloride layer 14, this layer being provided with a surface electrode 15 which is preferably perforated as at 16, and having a conductive lead 17 leading therefrom on the external or outer surface thereof. The electrode member 15 is preferably fabricated from the identical material as is employed for the plate 13 in order that galvanic effects and the like will be held to a minimum during operation of the device. A suitable thermal and electrical insulating body 18 is provided between the conductive metallic elements 11 and 12 in order that the conductors are more effectively electrically isolated, and in order that heat may be more efficiently extracted from the plate 13 at the thermal junction. Electrical power such as the battery source 19 is provided for the unit. While the battery source is conveniently utilized, it will be appreciated that either a battery or a suitably rectified A.C. source will be satisfactory for operation of the device. The thermoelectric circuit therefore includes the power source 19, the dissimilar conductive metallic members 11 and 12 together with suitable conductive leads 20 and 21. Of course, a hot junction must also be provided in cooperating relationship to the cold junction. For purposes of uniformity, it is preferred that the hot junction be kept at a substantially constant or known temperature while the apparatus is being employed as a hygrometer. A hot junction is shown in the drawing at 22. A meter 23 is provided to indicate the quantity of current flowing in the shunt or salt circuit. The shunt circuit as indicated is arranged to be connected between the salt layer 14 and the battery 19.

In operation, the cold junction is placed within the air or gaseous volume undergoing test for determination of its dew-point, relative humidity or the like, and power is supplied to the thermoelectric pair to commence cooling. The major current passes completely through the junction and a portion is extracted off across the salt layer, the quantity being dependent upon the energy required to heat the cooled salt layer back to equilibrium temperature. The operation is impaired substantially if the capacity of the output of the current source at any time exceeds the point at which heat generated in the thermoelectric junction due to Joule heat prevents cooling from occurring in the thermoelectric element. Initially, the conductivity of the salt film 14 is very low because of the fact that the film has not been sufficiently cooled, the salt being above the temperature at which water will condense thereon. Upon cooling to a sufficiently low temperature, depending upon the water content of the gas sample, water begins to condense on the salt layer and the conductivity increases at a rate depending upon the resistivity characteristics of the salt film. In other words, the increase in conductivity of the film provides an effective electrical path across the film and an increase in current flow across the salt layer occurs. With the increase of current flow through the salt film, a certain quantity of heat is generated therein and a portion of the condensed water is accordingly driven off. For a given driving current through the thermoelectric junction, there is a corresponding current which passes through the shunt circuit, and a measure of this shunt current provides a direct indication of the dew-point or relative humidity of the test sample. For calibration purposes, as the R.H. or dew-point of the gas sample decreases, less current will be required in order to drive off water vapor from the salt film. In addition, and in particular for relative humidity readings, the apparatus requires that the hot junction be maintained at a substantially uniform temperature; however, if this is not possible to achieve, it is possible to calibrate the unit for various hot junction temperatures.

If desired, the hot junction may be mounted on a suitable heat-sink or the like in order that constant temperature may be substantially available for the hot junction. Such an arrangement facilitates simple calibration of the unit depending upon the room temperature or other environmental conditions. Resistor 24 is arranged to control the flow of current through the thermoelectric circuit.

In connection with the salt films, various suitable salts may be employed; however, it is preferred that the salt used have a cation which is above copper in the electromotive series and it is important that the anion portion of the salt be non-corrosive toward copper for very obvious lifetime considerations. Suitable salts therefore, are those which have substantially equal acid and base characteristics in the anion and cation portions respectively. As examples of usable salts there are sodium and potassium sulphates and sodium and potassium chlorides. It is also generally preferred that the salts are not hydrolyzable.

With respect to the metallic electrodes employed in the thermoelectric refrigerator, a bismuth and lead telluride couple have been satisfactorily utilized. It will be appreciated that other metallic couples may be employed which have the property of generating and extracting thermal energy from dissimilar junction arrangements. As an example, thermoelectric pairs prepared from $Bi_2Te_3$, p-type vs. n-type, PbTe, p-type vs. n-type. Either of these may be alternatively employed vs. bismuth or other suitable metals.

It will be appreciated, of course, that various modifications of the present invention may be made without departing from the spirit and scope of the present invention. It will therefore be understood that the various examples given herein are for purposes of illustration only and are not to be construed as a limitation to the scope of the invention disclosed herein.

I claim as my invention:

1. An apparatus for determing the moisture content of a gaseous mixture comprising a source of electrical current, thermoelectric means having a junction which is arranged to be cooled upon passage of an electrical current therethrough, and current divider means in thermal and electrical contact with said junction, said current divider means including a support member with a film of a certain electrically conductive material disposed thereon and having electrical contact means arranged on a surface which is spaced from said support member, said electrically conductive material being characterized in that the electrical resistivity drops substantially upon substantial saturation with water, said current divider means being arranged to maintain the said electrically conductive material at an equilibrium moisture content.

2. Electrical hygrometer means including a thermally and electrically conductive base plate, a pair of electrical conductors forming a thermoelectric junction arranged along a first surface of said base plate and a layer of an electrolyte arranged along a second surface of said base plate, and circuit means for passing an electrical current through said junction and said electrolyte, said circuit means being arranged in current dividing relationship for current moving through said junction and said electrolyte, said electrolyte being characterized in that its resistivity varies inversely with water content.

3. Dew-point determining apparatus comprising a thermally and electrically conductive base plate, a pair of dissimilar metallic bodies forming a thermoelectric cooling junction and being arranged to make contact to a certain area of said base plate, and a film of a humidity responsive electrolyte being arranged on said base plate at a point removed from said thermoelectric cooling junction, an electrode making electrical contact with said electrolyte film at a point removed from said base plate, and circuit means being arranged to supply a quantity of electrical energy to said thermoelectric cooling junction to cool said base plate, said electrolyte being arranged to shunt said thermoelectric cooling junction in proportion to the relative quantity of water present in said electrolyte.

4. The apparatus as defined in claim 3 further characterized in that said electrolyte is selected from the class consisting of sodium and potassium sulphate and sodium and potassium chloride.

5. The apparatus of claim 3 being further characterized in that said thermoelectric junction is formed from a pair of dissimilar metallic bodies consisting essentially of bismuth and lead telluride.

6. Electrical hygrometer means including a thermally and electrically conductive base plate, a thermoelectric refrigerator arranged to extract heat from said plate, in thermal and electrical contact with said plate, a source of electrical current arranged to supply current to said thermoelectric refrigerator, and a film of an electrolyte being arranged on a surface of said plate in spaced relationship from said thermoelectric refrigerator and being provided with an external conductive electrode, said plate and external conductive electrode being arranged to form an electrical shunt path around said thermoelectric refrigerator and through said film, said electrolyte film being arranged to pass current in proportion to the degree of hydration of said electrolyte.

7. The apparatus as defined in claim 6 being further characterized in that means are provided for determining the quantity of current flowing through said electrical shunt path.

8. Electrical hygrometer means including a copper base plate, a thermoelectric refrigerator consisting essentially of a thermoelectric junction prepared from bismuth and lead telluride in thermal and electrical contact with said base plate and being arranged to extract heat therfrom; a source of electrical current arranged to supply current to said thermoelectric refrigerator and a film of electrolyte being arranged in superimposed relationship on said copper base plate, said electrolyte film being spaced from said thermoelectric refrigerator along said copper base plate and having an external copper electrode applied thereon and arranged to form an electrical current path therethrough.

9. The apparatus of claim 8 being particularly characterized in that said electrolyte is selected from the class consisting of sodium and potassium sulphate and sodium and potassium chloride.

References Cited in the file of this patent

UNITED STATES PATENTS

| | | |
|---|---|---|
| 1,804,072 | Turrettini | May 2, 1931 |
| 2,458,348 | Cleveland | Jan. 4, 1949 |
| 2,671,334 | Gunn | Mar. 9, 1954 |
| 2,685,608 | Justi | Aug. 3, 1954 |
| 2,721,479 | Faus | Oct. 25, 1955 |